United States Patent
Nakamura et al.

(10) Patent No.: US 6,524,643 B1
(45) Date of Patent: Feb. 25, 2003

(54) METHOD FOR PREPARING LAYERED STRUCTURE INCLUDING OXIDE SUPERCONDUCTOR THIN FILM

(75) Inventors: Takao Nakamura, Osaka (JP); Michitomo Iiyama, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 781 days.

(21) Appl. No.: 08/907,494

(22) Filed: Aug. 8, 1997

(30) Foreign Application Priority Data

Aug. 8, 1996 (JP) .............................. 8-225854

(51) Int. Cl.[7] .............................. B05D 5/12; C23C 16/40
(52) U.S. Cl. ................ 427/62; 427/255.29; 427/419.3; 427/596; 505/473; 505/238; 505/732; 117/108
(58) Field of Search .................. 505/473, 238, 505/729, 732; 427/62, 255.3, 419.3, 596, 255.29; 117/108

(56) References Cited

U.S. PATENT DOCUMENTS 5,423,914 A  *  6/1995  Nakamura et al. .......... 118/719

FOREIGN PATENT DOCUMENTS

| EP | 0 299 879 A | 1/1989 |
| EP | 0 546 946 A | 6/1993 |
| JP | 63-274190 | * 11/1988 |

OTHER PUBLICATIONS

Kingston Et Al, Appl. Phys. Lett. 56(2), Jan. 1990, p. 189–191.*

* cited by examiner

*Primary Examiner*—Bret B. Chen
(74) *Attorney, Agent, or Firm*—Foley & Lardner

(57) ABSTRACT

The invention provides a method for preparing a layered structure comprising a lower thin film composed of an oxide superconductor and an upper thin film composed of a material different from the oxide superconductor on a substrate. The lower thin film is deposited by a molecular beam deposition process and the upper thin film is deposited by a process having a deposition rate faster than that of the molecular beam deposition process.

12 Claims, 5 Drawing Sheets

METHOD FOR PREPARING LAYERED STRUCTURE INCLUDING OXIDE SUPERCONDUCTOR THIN FILM

BACKGROUND OF THE INVENTION

1. Field of the Invention

The present invention relates to a method for preparing a layered structure including an oxide superconductor thin film, and more specifically to an improved method for preparing a layered structure including an oxide superconductor thin film and a dielectric thin film and/or an insulator thin film, which has a clear interface with negligible interface states, high crystallinity and excellent properties. The method is preferably applied to forming a gate structure of a superconducting field effect transistor including a superconducting channel of oxide superconductor, a gate insulator and a gate electrode stacked in the named order.

2. Description of Related Art

Various processes, such as reactive co-evaporation which is one of molecular beam epitaxy (MBE), pulsed laser deposition (PLD), sputtering, etc. are studied to prepare oxide superconductor thin films. Each process has features and drawbacks, and oxide superconductor thin films formed by each process have characteristics. Therefore, the selection of the process is determined by a use of the oxide superconductor thin film.

For example, a high quality oxide superconductor thin film having excellent superconducting properties, high crystallinity and a smooth surface can be prepared by the reactive co-evaporation. However, it takes a long time to prepare an oxide superconductor thin film by the reactive co-evaporation. The pulsed laser deposition has a fast deposition rate. However, an oxide superconductor thin film prepared by the pulsed laser deposition has a rather rough surface and rather low surface crystallinity. The sputtering has characteristics intermediate between the reactive co-evaporation and pulsed laser deposition. It has a deposition rate intermediate between those of the reactive co-evaporation and pulsed laser deposition. An oxide superconductor thin film prepared by the sputtering has a quality intermediate between those of the reactive co-evaporation and pulsed laser deposition.

The oxide superconductor thin film is used for superconducting devices utilizing the oxide superconductor material. One of the most important three-terminal superconducting devices is a field effect transistor type superconducting device (abbreviated as super-FET hereinafter) having a channel of a superconductor formed between a source and a drain. In this superconducting device, a current flowing through the superconducting channel is controlled by a signal voltage applied to a gate formed above the superconducting channel.

The super-FET mentioned above is a voltage controlled device which is capable of isolating output signals from input ones and of having a well defined gain. In addition, it has a large current capability.

A layered structure including an oxide superconductor thin film and another thin film is utilized for the above super-FET and the tunnel type Josephson junction device. In the super-FET, a depletion region generated in the oxide superconductor thin film by means of an electric field penetrating from a surface of the oxide superconductor thin film is utilized. In the tunnel type Josephson junction device, tunnel current flowing through the layered structure is utilized. The oxide superconductor thin films of the layered structures of these devices are required to have uniform superconductivity through the entire thickness.

In order to prepare a layered structure by stacking a thin film of an oxide material on an oxide superconductor thin film, the surface of the oxide superconductor thin film should be smooth and clean at the atomic level and an atomic plane should be exposed in the surface. For this purpose, deposition processes utilizing molecular beams under ultra high vacuum backgrounds, such as MBE including reactive co-evaporation, etc. (abbreviated as molecular beam deposition processes hereinafter) are considered to be preferable. An oxide superconductor thin film having a crystal structure continuous to a surface, a smooth and clean surface can be prepared by the molecular beam deposition process.

A deposition rate of the above molecular beam deposition process is kept low to improve crystallinity of a deposited thin film. A partial pressure of an oxidation source is decreased as low as possible to prevent contamination of a growing surface of the deposited thin film and oxidation of vapor sources in the above molecular beam deposition process. These may cause inconvenience when a layered structure of an oxide superconductor thin film and an oxide insulator thin film stacked in the named order are prepared by continuously depositing these thin films by the molecular beam deposition process.

For example, if a reducing material, such as $SrTiO_3$ (abbreviated as STO hereinafter), $BaTiO_3$ (abbreviated as BTO hereinafter), $Ba_xSr_{1-x}TiO_3$ (0<x<1; abbreviated as BSTO hereinafter), is used for the insulator thin film of the above layered structure and the layered structure is formed by the molecular beam deposition process, oxygen of the lower layer of the oxide superconductor thin film is absorbed in the insulator during a long deposition process. In addition, oxygen is liable to escape from the oxide superconductor thin film since it is held at a high temperature for a long time. In case of the oxide superconductor thin film alone, oxygen is again introduced into the oxide superconductor thin film while a temperature is lowered. However, in case of the layered structure, the insulator thin film interrupts the re-introduction of oxygen. By all of these, oxygen deficits are generated in the oxide superconductor thin film, which decrease its critical temperature and ultimately, the oxide superconductor thin film loses its superconductivity.

Thus, the oxide superconductor thin film of the layered structure prepared by the molecular beam deposition process has poor superconducting properties at least at a portion which is in contact with the insulator thin film. Now this problem will be explained more definitely with reference to the accompanying drawings.

BRIEF DESCRIPTION OF THE DRAWINGS

FIG. 1 is a graph showing variations of critical temperatures of 5 nm-thick $Y_1Ba_2Cu_3O_{7-x}$ oxide superconductor thin films deposited on STO substrates when the oxide superconductor thin films are heated to high temperatures. The $Y_1Ba_2Cu_3O_{7-x}$ oxide superconductor thin films have a thickness of 5 nanometers and were deposited by reactive co-evaporation under the following condition:

Substrate: STO(100), surface treating by using buffer solution of hydrofluoric acid
Substrate Temperature: 700° C.
Deposition Rate: 0.2 nm/min.

Figure 1:
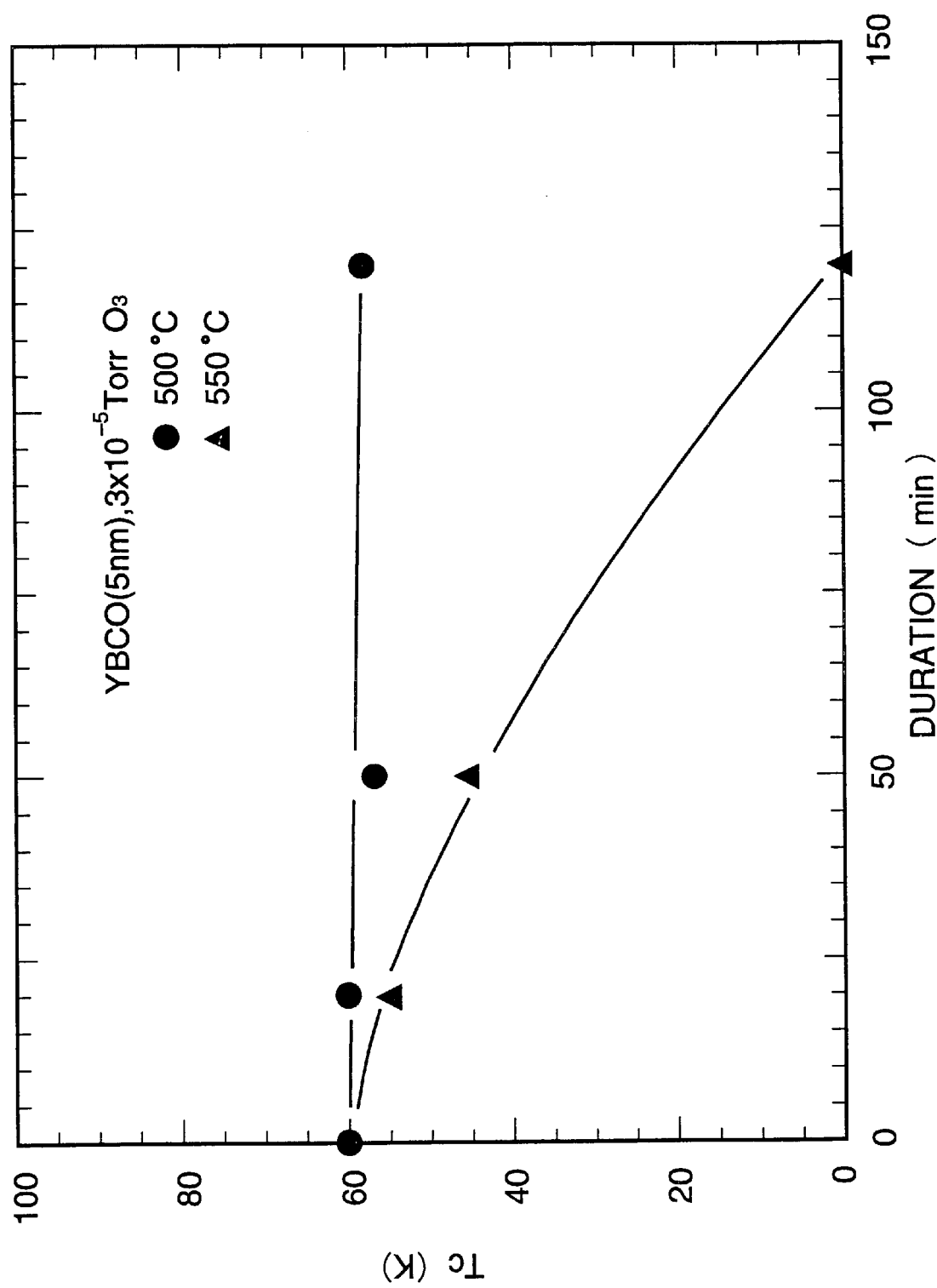
FIG. 1 is a graph showing variations of critical temperatures of 5 nm-thick $Y_1Ba_2Cu_3O_{7-x}$ oxide superconductor thin films deposited on STO substrates when the films are heated.

The $Y_1Ba_2Cu_3O_{7-x}$ oxide superconductor thin films were heated and maintained at temperatures of 500° C. and 550° C. under an atmosphere of $O_3$ of $3\times10^{-5}$ Torr ($3.999\times10^{-3}$ Pa). As shown in FIG. 1, the critical temperature of the 5 nm-thick $Y_1Ba_2Cu_3O_{7-x}$ oxide superconductor thin film was not changed by heating the thin film to a temperature of 500° C. However, in case of heating to a temperature of 550° C., the critical temperature of the $Y_1Ba_2Cu_3O_{7-x}$ oxide superconductor thin film was decreased along with elapse of time.

Figure 2:
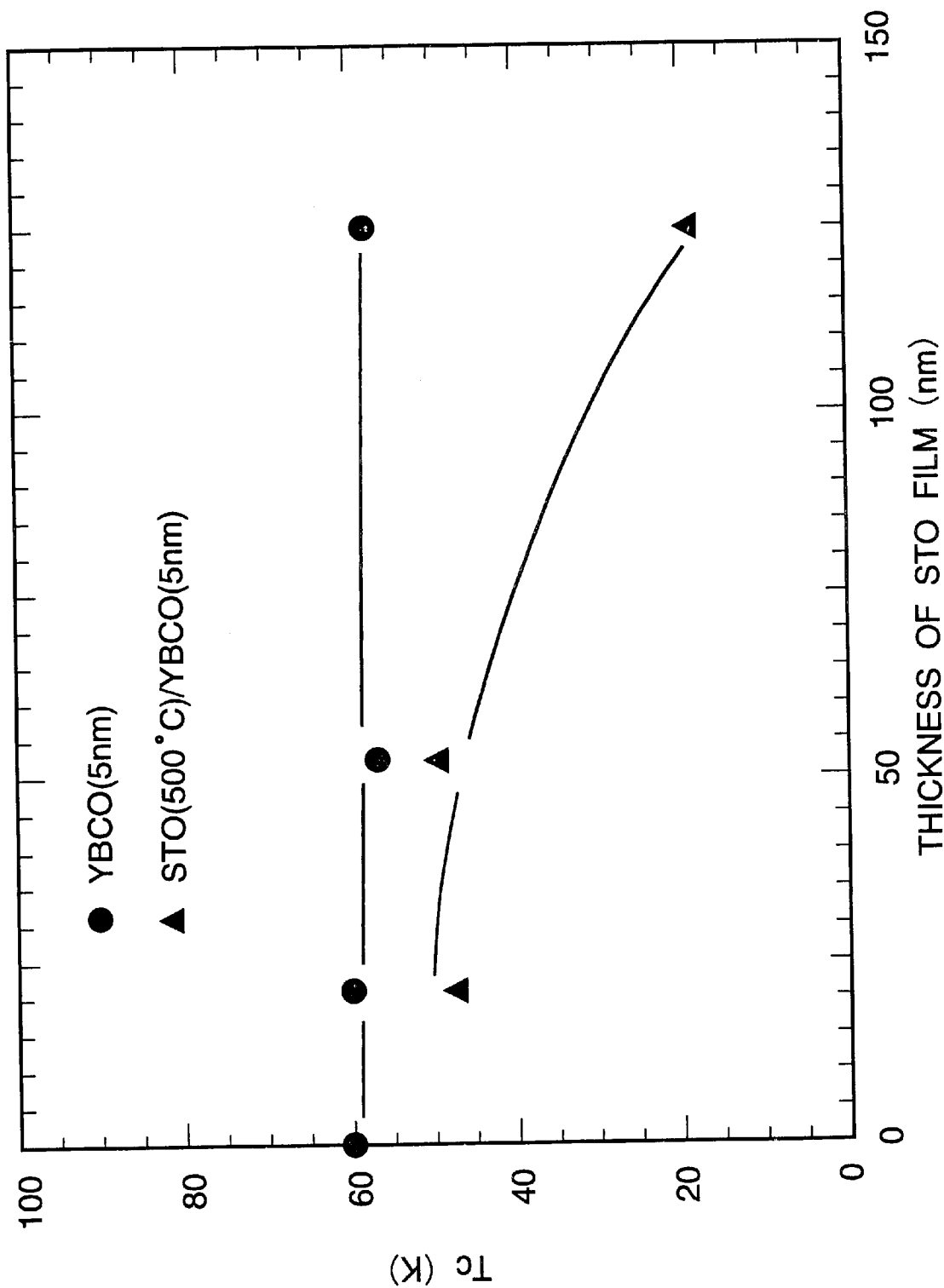
FIG. 2 is a graph showing relations between thickness of STO thin films deposited on 5 nm-thick $Y_1Ba_2Cu_3O_{7-x}$ oxide superconductor thin films at a temperature of 500° C. and the critical temperatures of the 5 nm-thick $Y_1Ba_2Cu_3O_{7-x}$ oxide superconductor thin films.

FIG. 2 is a graph showing relations between thickness of STO thin films deposited on 5 nm-thick $Y_1Ba_2Cu_3O_{7-x}$ oxide superconductor thin films at a temperature of 500° C. and the critical temperatures of the $Y_1Ba_2Cu_3O_{7-x}$ oxide superconductor thin films. The STO films were were deposited by reactive co-evaporation under the following condition:

Substrate Temperature: 500° C.
Deposition Atmosphere: $5\times10^{-5}$ Torr ($6.665\times10^{-3}$ Pa)
Deposition Rate: 1 nm/min.

As shown in FIG. 2, the critical temperatures of the $Y_1Ba_2Cu_3O_{7-x}$ oxide superconductor thin films were decreased along with increase of thickness of the STO thin films. This means that the STO thin films absorbs oxygen in the $Y_1Ba_2Cu_3O_{7-x}$ oxide superconductor thin films.

Figure 3:
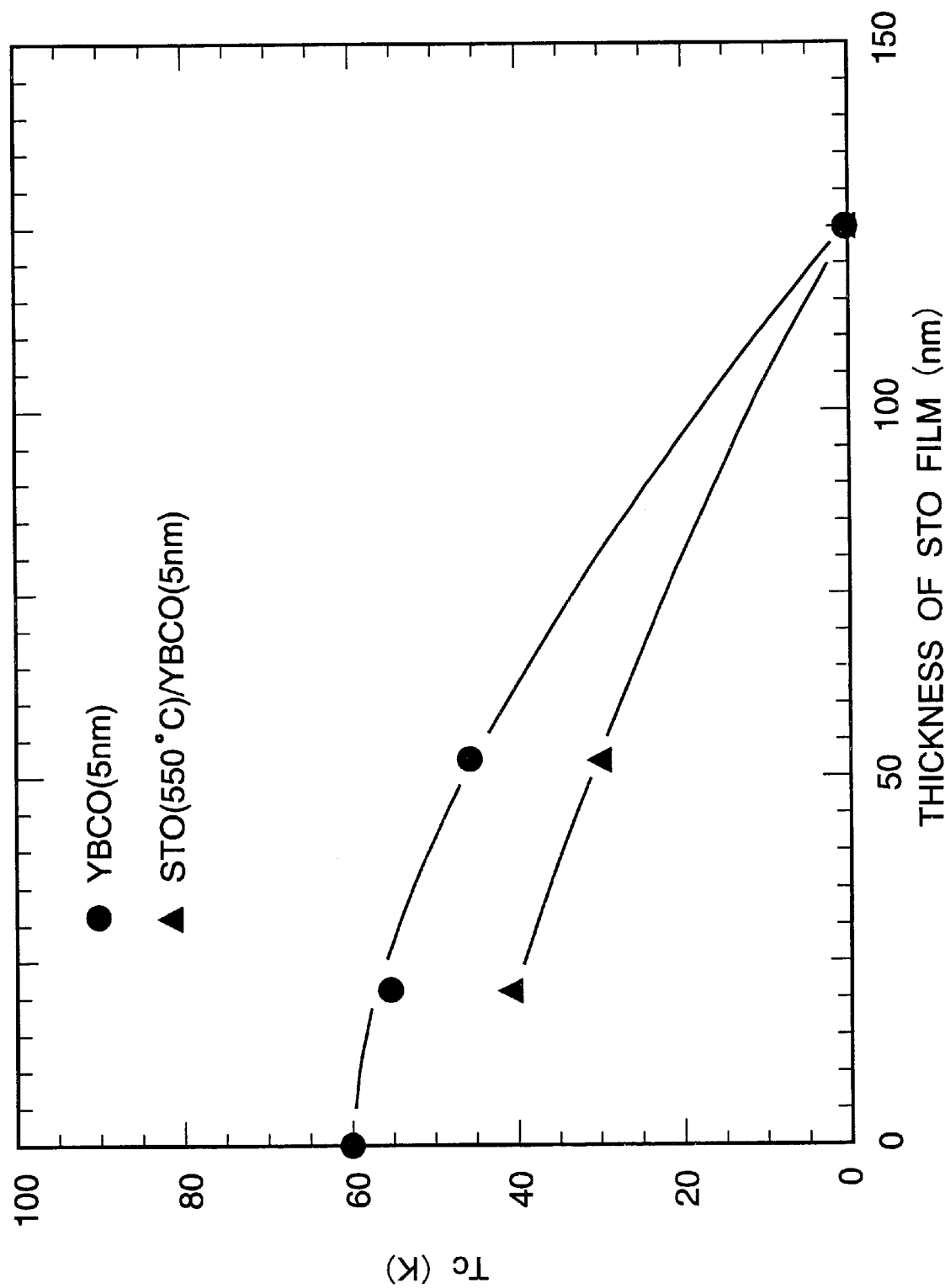
FIG. 3 is a graph showing relations between thickness of STO thin films deposited on $Y_1Ba_2Cu_3O_{7-x}$ oxide superconductor thin films at a temperature of 550° C. and the critical temperatures of the $Y_1Ba_2Cu_3O_{7-x}$ oxide superconductor thin films.

FIG. 3 is a graph showing relations between thickness of STO thin films deposited on 5 nm-thick $Y_1Ba_2Cu_3O_{7-x}$ oxide superconductor thin films at a temperature of 550° C. and the critical temperatures of the $Y_1Ba_2Cu_3O_{7-x}$ oxide superconductor thin films. The deposition condition of the STO films was equal to that of the STO films of FIG. 2 excluding the substrate temperature of 550° C.

As shown in FIG. 3, the critical temperatures of the $Y_1Ba_2Cu_3O_{7-x}$ oxide superconductor thin films were far decreased along with increase of thickness of the STO thin films. This means that oxygen escapes from the $Y_1Ba_2Cu_3O_{7-x}$ oxide superconductor thin films at a temperature of 550° C. in addition to absorption of oxygen in the $Y_1Ba_2Cu_3O_{7-x}$ oxide superconductor thin films by the STO thin films.

From the above experimentals, in order to prevent degradation of the lower layer oxide superconductor thin film, it is considered to be effective to shorten deposition time of the insulator thin film, to increase oxidation ability during deposition of the insulator thin film and/or to decrease deposition temperature of the insulator thin film.

However, it is very difficult to increase deposition rate in the molecular beam deposition process since deposition rate is determined by temperatures of Knudsen's cells of constituent elements. The temperatures of the Knudsen's cells also determine compositions of the deposited thin films. If temperatures of Knudsen's cells are raised to increase deposition rate, it is very difficult to control composition of the deposited film. Therefore, deposition rate in the molecular beam deposition process is limited.

If oxidation ability during deposition of the insulator thin film is increased, the vapor sources are oxidized so that it becomes difficult to control the Knudsen's cells. Therefore, oxidation ability in the molecular beam deposition process is limited.

If deposition temperature of the insulator thin film is decreased, crystallinity of the insulator thin film becomes poor so as to degrade the withstand voltage of the insulator thin film.

SUMMARY OF THE INVENTION

Accordingly, it is an object of the present invention to provide a method for preparing a layered structure including an oxide superconductor thin film which overcomes the above defects of the prior art.

The above and other objects of the present invention are achieved in accordance with the present invention by a method for preparing a layered structure comprising a lower thin film composed of an oxide superconductor and an upper thin film composed of a material different from the oxide superconductor on a substrate wherein the lower thin film is deposited by a molecular beam deposition process and the upper thin film is deposited by a process having a deposition rate faster than that of the molecular beam deposition process.

In a preferred embodiment, the oxide superconductor is formed of a high-$T_c$ (high critical temperature) oxide superconductor, particularly, formed of a high-$T_c$ copper-oxide type compound oxide superconductor for example a Y—Ba—Cu—O type compound oxide superconductor material, a Bi—Sr—Ca—Cu—O type compound oxide superconductor material, and a Ti—Ba—Ca—Cu—O type compound oxide superconductor material.

According to the invention, the process depositing the upper thin film may be pulsed laser deposition, CVD or MO-CVD. In one preferable embodiment, a protective layer can be formed on the lower thin film by a molecular beam deposition process without breaking the vacuum and without transfer of the substrate. The protective layer can be composed of a material equal to that of the upper thin film so that it will be incorporated with the upper thin film after deposition of the upper thin film. The protective layer may have a thickness of 2–5 nanometers. Therefore, the deposition time becomes short even if the protective layer is deposited by a molecular beam deposition process. This means that the deposition of the protective layer does not have adverse effect on the lower thin film.

According to the invention, the lower thin film may be maintained under vacuum until the upper thin film is deposited. This means that the lower thin film may be maintained under an atmosphere equivalent to that of the deposition. This prevents degradation of a surface of the lower thin film of an oxide superconductor.

The lower thin film may be cooled until the upper thin film is deposited. It can be more preferable to cool the lower thin film to the room temperature. By this, oxygen is introduced into the oxide superconductor of the lower thin film and oxygen in the oxide superconductor is prevented from escaping.

The above and other objects, features and advantages of the present invention will be apparent from the following description of preferred embodiments.

DESCRIPTION OF THE PREFERRED EMBODIMENTS

Embodiment 1

A layered structure of a lower thin film of $Y_1Ba_2Cu_3O_{7-x}$ oxide superconductor and an upper thin film of STO dielectric oxide was formed on a $SrTiO_3$ (100) substrate by the method in accordance with the invention. Referring to FIGS. 4A to 4D, the process will be explained.

Figure 4A:
FIGS. 4A–4D are diagrammatic plane views for illustrating an embodiment of the method for preparing the layered structure in accordance with the present invention.

At first, a $Y_1Ba_2Cu_3O_{7-x}$ oxide superconductor thin film 1 having a thickness of 5 nanometers was deposited on a STO (100) substrate 5 by reactive co-evaporation, as shown in FIG. 4A. The deposition condition was as follows:

Substrate: STO(100), surface treating by using buffer solution of hydrofluoric acid
Substrate Temperature: 700° C.
Vapor Source: Y, Ba, Cu
Deposition Atmosphere: $3\times10^{-5}$ Torr ($3.999\times10^{-3}$ Pa; $O_3$) (in the vicinity of the substrate)
Deposition Rate: 0.2 nm/min.

Figure 4B:
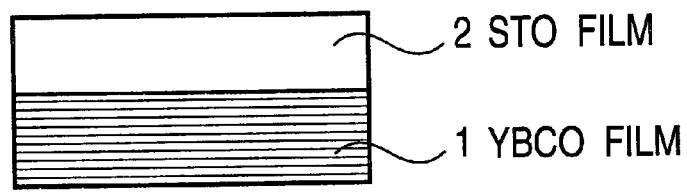

Then, the deposited $Y_1Ba_2Cu_3O_{7-x}$ oxide superconductor thin film was transferred to a deposition chamber for pulsed laser deposition without breaking the vacuum. A STO thin film 2 having a thickness of 320 nanometers was deposited on a half part of the $Y_1Ba_2Cu_3O_{7-x}$ oxide superconductor thin film by pulsed laser deposition, as shown in FIG. 4B. The deposition condition was as follows:

Substrate Temperature: 600° C.
Laser Intensity: 2 Joule/cm$^2$ (on target)
Laser Diameter: 1 millimeter $\phi$
Repetition Rate 3 Hz
Deposition Atmosphere: 0.03 Torr (3.999 Pa)
Duration: 8 min.
Deposition Rate: 40 nm/min.

Figure 4C:
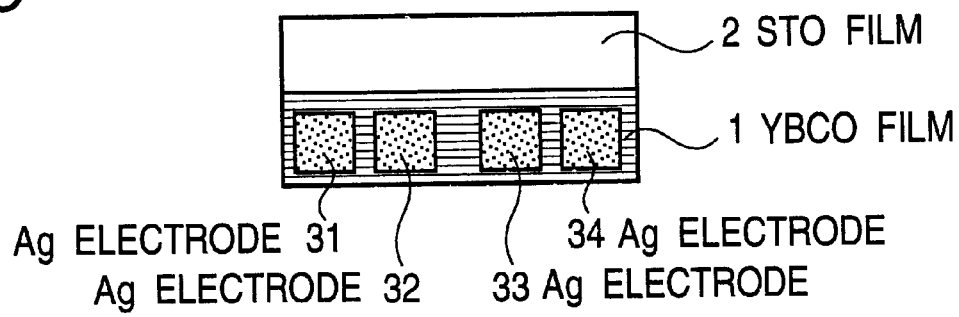
Figure 4D:
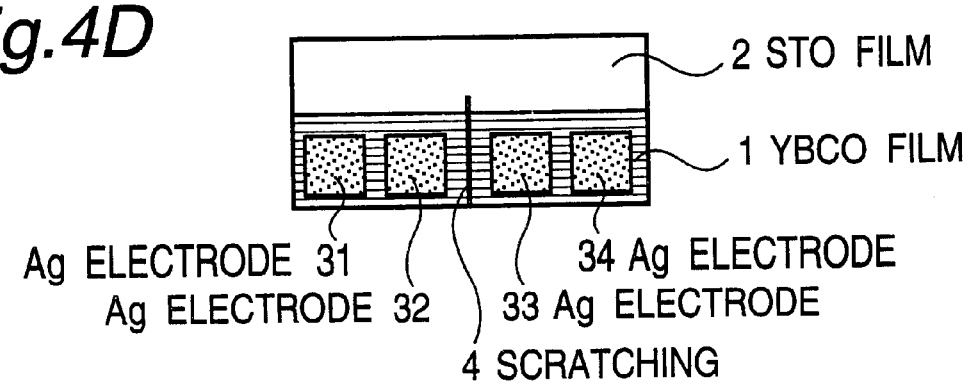

Four Ag electrodes 31–34 were formed on the exposed portion of the $Y_1Ba_2Cu_3O_{7-x}$ oxide superconductor thin film 1, as shown in FIG. 4C, to evaluate superconducting properties of the lower $Y_1Ba_2Cu_3O_{7-x}$ oxide superconductor thin film 1 of the above layered structure. The critical temperature of the exposed portion of the $Y_1Ba_2Cu_3O_{7-x}$ oxide superconductor thin film 1 was 60 K. Then, the exposed portion of the $Y_1Ba_2Cu_3O_{7-x}$ oxide superconductor thin film 1 was scratched between the electrodes 32 and 33 so as to divide the exposed portion into two part. By this, the divided two part of the exposed portion of the $Y_1Ba_2Cu_3O_{7-x}$ oxide superconductor thin film 1 was electrically connected to each other only through the portion of the $Y_1Ba_2Cu_3O_{7-x}$ oxide superconductor thin film under the STO thin film. Thus, the critical temperature of a portion of the $Y_1Ba_2Cu_3O_{7-x}$ oxide superconductor thin film under the STO thin film could be measured. The critical temperature of a portion of the $Y_1Ba_2Cu_3O_{7-x}$ oxide superconductor thin film under the STO thin film was 50 K. It was confirmed that the lower $Y_1Ba_2Cu_3O_{7-x}$ oxide superconductor thin film of the layered structure prepared by the above method according to the present invention maintained its superconductivity.

Embodiment 2

A protective layer of STO having a thickness of 3 nanometers was deposited by reactive co-evaporation on a $Y_1Ba_2Cu_3O_{7-x}$ oxide superconductor thin film having a thickness of 5 nanometers without breaking the vacuum and without transfer of the substrate. The $Y_1Ba_2Cu_3O_{7-x}$ oxide superconductor thin film was deposited under a condition equal to Embodiment 1. The condition of depositing the STO protective layer was as follows:

Substrate Temperature: 500° C.
Vapor Source: Ti, Sr
Deposition Atmosphere: $3\times10^{-5}$ Torr ($3.999\times10^{-3}$ Pa; $O_3$) (in the vicinity of the substrate)
Deposition Rate: 1 nm/min.

Then, the $Y_1Ba_2Cu_3O_{7-x}$ oxide superconductor thin film having a protective layer of STO was transferred to a deposition chamber for pulsed laser deposition to deposit a STO thin film having a thickness of 320 nanometers on it. The deposition condition was equal to Embodiment 1.

Figure 5:
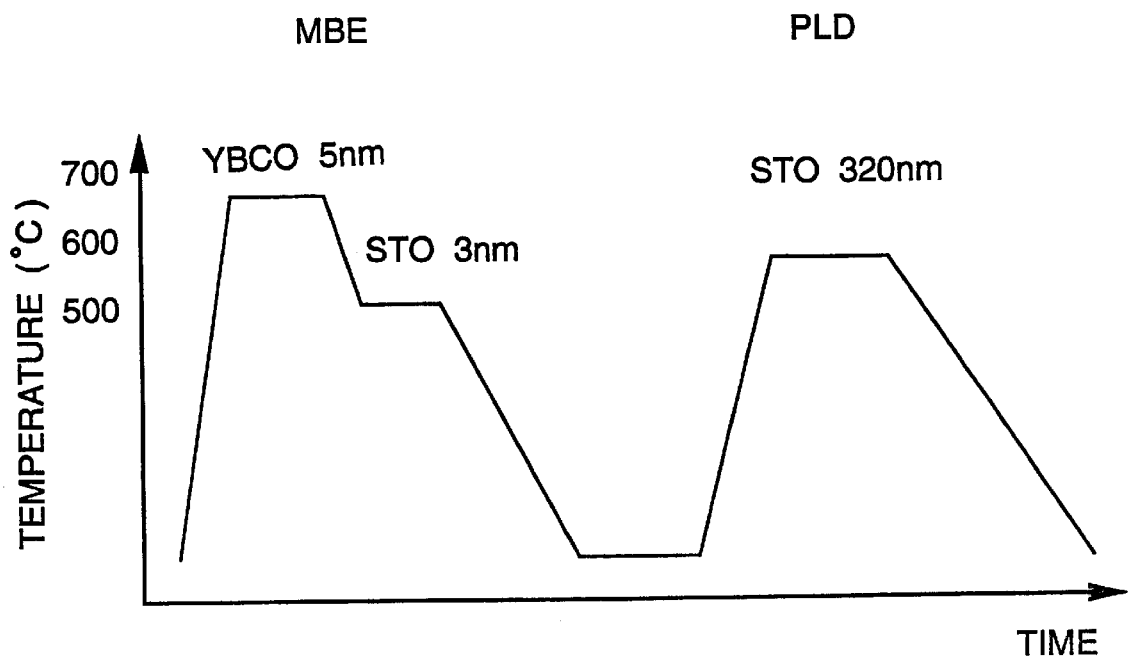
FIG. 5 is a graph showing change in substrate temperature during the process for preparing the layered structure in accordance with the present invention.

FIG. 5 is a graph showing change in substrate temperature during the above process for preparing the layered structure in accordance with the present invention.

Superconducting properties of the lower $Y_1Ba_2Cu_3O_{7-x}$ oxide superconductor thin film of the above layered structure were measured by means of a method equal to Embodiment 1. The critical temperature of a portion of the $Y_1Ba_2Cu_3O_{7-x}$ oxide superconductor thin film under the STO thin film was 49.5 K and an exposed portion of the $Y_1Ba_2Cu_3O_{7-x}$ oxide superconductor thin film was 59.3 K.

Figure 6:
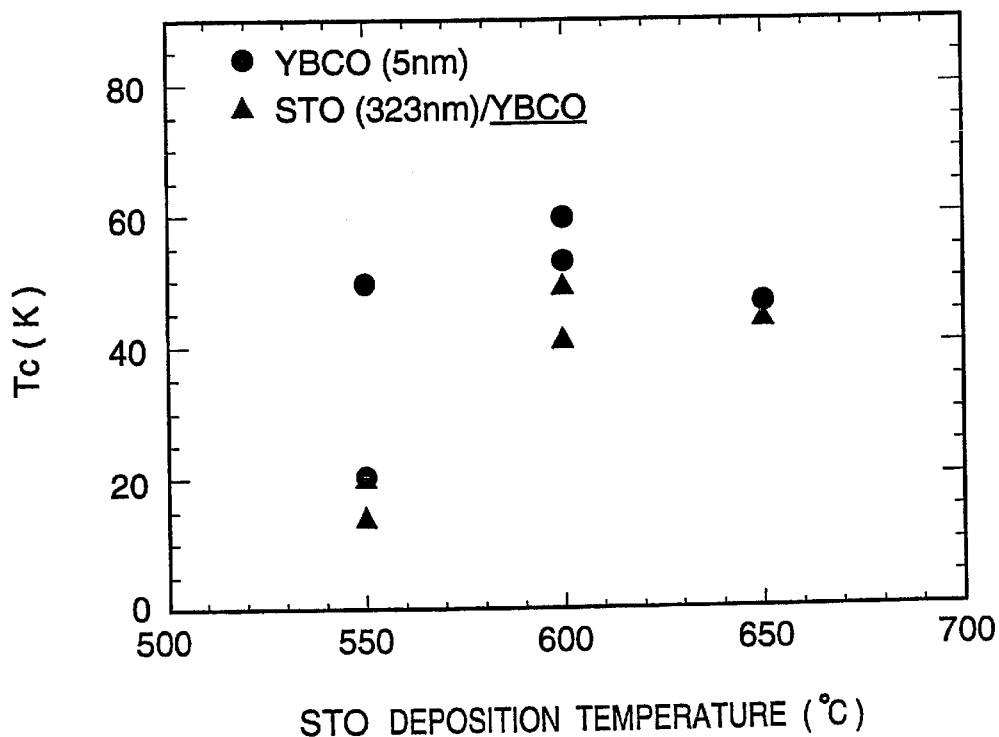
FIG. 6 is a graph showing relations between deposition temperature of STO thin films deposited on $Y_1Ba_2Cu_3O_{7-x}$ oxide superconductor thin films and the critical temperatures of the $Y_1Ba_2Cu_3O_{7-x}$ oxide superconductor thin films.

FIG. 6 is a graph showing relations between deposition temperature of STO thin films deposited on $Y_1Ba_2Cu_3O_{7-x}$ oxide superconductor thin films and the critical temperatures of the $Y_1Ba_2Cu_3O_{7-x}$ oxide superconductor thin films. As shown in FIG. 6, the lower $Y_1Ba_2Cu_3O_{7-x}$ oxide superconductor thin films of all the layered structures prepared by the method according to the present invention kept superconductivity, when the upper STO thin films were deposited at substrate temperatures of 550° C., 600° C. and 650° C. In particular, when the upper STO thin film was deposited at temperatures of 600° C. the lower $Y_1Ba_2Cu_3O_{7-x}$ oxide superconductor thin film had the high critical temperature even under the STO film. It was considered that mutual diffusion occurred between the lower $Y_1Ba_2Cu_3O_{7-x}$ oxide superconductor thin film and the upper STO film which spoiled the critical temperature when the STO film was deposited at a substrate temperature of 650° C.

Thus, it was confirmed that the lower $Y_1Ba_2Cu_3O_{7-x}$ oxide superconductor thin film of the layered structure prepared by the above method according to the present invention maintained its superconductivity.

Embodiment 3

A protective layer of STO having a thickness of 3 nanometers were deposited by reactive co-evaporation on a $Y_1Ba_2Cu_3O_{7-x}$ oxide superconductor thin film having a thickness of 5 nanometers without breaking the vacuum. The $Y_1Ba_2Cu_3O_{7-x}$ oxide superconductor thin film was deposited under a condition equal to Embodiment 1 and the protective layer of STO was deposited under a condition equal to Embodiment 2.

Then, the $Y_1Ba_2Cu_3O_{7-x}$ oxide superconductor thin film having a protective layer of STO was transferred to a deposition chamber for CVD to deposit a STO thin film having a thickness of 320 nanometers on it. The deposition condition was as follows:

Substrate Temperature: 600° C.
Vapor Source: $Ti(C—OC_3H_7)_4$, $Sr(DPM)_2$ DPM: dipivaloylmethanato Deposition Atmosphere: 5 Torr (666.5 Pa; $O_3$)

Duration 6 min.

Deposition Rate: 20 nm/min.

Superconducting properties of the lower $Y_1Ba_2Cu_3O_{7-x}$ oxide superconductor thin film of the above layered structure were measured. The critical temperature of a portion of the $Y_1Ba_2Cu_3O_{7-x}$ oxide superconductor thin film under the STO thin film was 25.4 K and an exposed portion of the $Y_1Ba_2Cu_3O_{7-x}$ oxide superconductor thin film was 46.6 K. Thus, it was confirmed that the lower $Y_1Ba_2Cu_3O_{7-x}$ oxide superconductor thin film of the layered structure prepared by the above method according to the present invention maintained its superconductivity.

As explained above, a layered structure of an oxide superconductor thin film and a thin film of a different material having excellent properties can be obtained by the method in accordance with the present invention. The layered structure can be favorably applied to superconducting devices, in particular a gate structure of the super-FET and a layered structure having a Pt monolayer on an oxide superconductor layer.

The invention has thus been shown and described with reference to the specific embodiments. However, it should be noted that the present invention is in no way limited to the details of the illustrated structures but converts and modifications may be made within the scope of the appended claims.

The entire disclosure of Japanese Patent Application No. 8-225854 filed on Aug. 8, 1996 including specification, claims, drawings and summary are incorporated herein by reference in its entirety.

What is claimed is:

1. A method for preparing a layered structure comprising a lower thin film composed of an oxide superconductor and an upper thin film composed of a material different from the oxide superconductor on a substrate wherein the lower thin film is deposited by a molecular beam deposition process and the upper thin film is deposited by a process other than a molecular beam deposition process, having a deposition rate faster than that of the molecular beam deposition process.

2. A method as claimed in claim 1, wherein the process depositing the upper thin film is pulsed laser deposition.

3. A method as claimed in claim 1, wherein the process depositing the upper thin film is CVD.

4. A method as claimed in claim 3, wherein the process depositing the upper thin film is MO-CVD.

5. A method as claimed in claim 1, wherein prior to depositing said upper thin film, a protective layer is formed on the lower thin film by a molecular beam deposition process without breaking vacuum and without transfer of the substrate.

6. A method as claimed in claim 5, wherein the protective layer and the upper protective layer are formed of the same material.

7. A method as claimed in claim 1, wherein the lower thin film is maintained under vacuum until the upper thin film is deposited.

8. A method as claimed in claim 1, wherein the lower thin film is cooled until the upper thin film is deposited.

9. A method as claimed in claim 1, wherein the upper thin film is selected from the group consisting of $SrTiO_3$, $BaTiO_3$, and $Ba_xSr_{1-x}O_3$, $0<x<1$.

10. A method as claimed in claim 1, wherein the oxide superconductor comprises a copper oxide superconducting material.

11. A method as claimed in claim 1, wherein the oxide superconductor is selected from the group consisting of Y—Ba—Cu—O, Bi—Sr—Ca—Cu—O, and Ti—Ba—Ca—Cu—O materials.

12. A method as claimed in claim 1, wherein the lower thin film is deposited by reactive co-evaporation.

* * * * *